(12) United States Patent
Dumas et al.

(10) Patent No.: US 6,771,138 B1
(45) Date of Patent: Aug. 3, 2004

(54) METHOD OF FORMING A BI-DIRECTIONAL SYNCHRONIZATION CONTROLLER

(75) Inventors: Jeffrey Dumas, West Warwick, RI (US); Benjamin M. Rice, Attleboro, MA (US)

(73) Assignee: Semiconductor Component Industries, L.L.C., Phoenix, AZ (US)

( * ) Notice: Subject to any disclaimer, the term of this patent is extended or adjusted under 35 U.S.C. 154(b) by 0 days.

(21) Appl. No.: 10/359,319

(22) Filed: Feb. 7, 2003

(51) Int. Cl.[7] .................................................. H03K 3/02
(52) U.S. Cl. ........................................ 331/143; 363/71
(58) Field of Search ........................... 331/143; 363/71, 363/72; 323/272; 307/87

(56) References Cited

U.S. PATENT DOCUMENTS

| | | | |
|---|---|---|---|
| 4,886,981 A | * | 12/1989 | Lentini et al. ................ 307/87 |
| 5,142,217 A | | 8/1992 | Gontowski, Jr. |
| 5,684,684 A | | 11/1997 | Harris et al. |
| 5,982,645 A | * | 11/1999 | Levran et al. ................. 363/37 |
| 6,262,901 B1 | * | 7/2001 | Simopoulos ................. 363/72 |

* cited by examiner

*Primary Examiner*—Robert Pascal
*Assistant Examiner*—Joseph Chang
(74) *Attorney, Agent, or Firm*—Robert F. Hightower

(57) ABSTRACT

A method of forming a power supply timing controller circuit (10, 80, 90) includes forming a bi-directional synchronization oscillator controller (11, 81, 91) to oscillate at an internal frequency. The bi-directional synchronization oscillator controller (11, 81, 91) receives an external sync signal, suspends the oscillation, begins operating at the forced frequency of the external sync signal, and begins a delay period. If another external sync signal is not received before the end of the delay period, the controller resets and once again begins oscillating at the internal frequency.

18 Claims, 4 Drawing Sheets

US 6,771,138 B1

METHOD OF FORMING A BI-DIRECTIONAL SYNCHRONIZATION CONTROLLER

BACKGROUND OF THE INVENTION

The present invention relates, in general, to electronics, and more particularly, to methods of forming semiconductor devices and structure.

In the past, the electronics industry utilized various techniques to implement distributed systems including distributed power systems and particularly power systems that used multiple power supply controllers. Typically, such multiple power supply controllers each utilized a separate oscillator for controlling each power supply. The power supply systems typically connected the power supply controllers together and synchronized all the oscillators to a frequency of the oscillator of one of the power supply controllers. Such power supply systems and power supply controllers are the subject of U.S. Pat. No. 5,142,217 by inventor Walter S. Gontowski Jr. issued on Aug. 25, 1992 and U.S. Pat. No. 5,684,684 by inventors Harris et al issued on Nov. 4, 1997.

One problem with such power supply controllers and power supply systems was jitter of the oscillator frequency. Typically, the power supply controllers synchronized the frequency of the internal oscillator to the oscillator in the power supply system that had the highest frequency. If the frequency differential between the oscillators was less than about ten (10) percent, the power supply controllers typically alternated between being the synchronizing controller and the synchronized controller. This alternating back-and-forth caused the oscillator frequency to jitter resulting in improper operation of the power supply regulator and power supply system. Additionally, the power supply controllers typically could only synchronize to the fastest frequency of the oscillators in the power supply system.

Accordingly, it is desirable to have a power supply controller that can synchronize to frequencies that are higher and lower than the controller's oscillator frequency, that does not have jitter in the oscillator frequency, and that does not alternate between being the synchronized and synchronizing frequency.

For simplicity and clarity of illustration, elements in the figures are not necessarily to scale, and the same reference numbers in different figures denote the same elements. Also, descriptions and details of well known steps and elements are omitted for simplicity of the description. Additionally, the terms set, high, or high level refer to a voltage level associated with a logic one, and the terms cleared, reset, low, or low level refer to a voltage level associated with a logic zero.

DETAILED DESCRIPTION OF THE DRAWINGS

Figure 1:
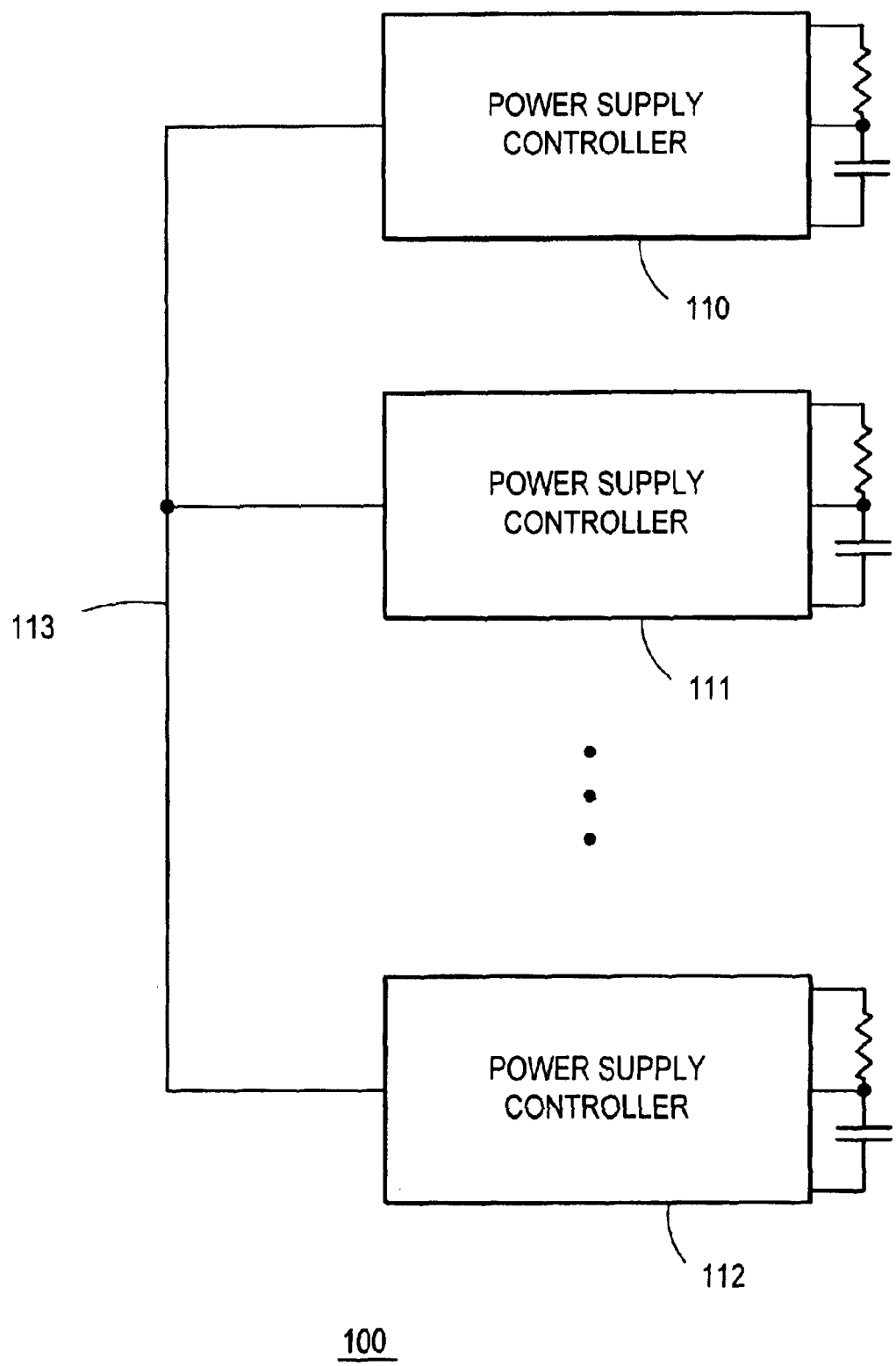
FIG. 1 schematically illustrates an embodiment of a portion of a power supply system in accordance with the present invention.

FIG. 1 schematically illustrates a portion of an embodiment of a power supply system 100 that utilizes a plurality of power supply controllers including a power supply controller 110, a power supply controller 111, and a power supply controller 112. Each of controllers 110, 111, and 112 include an internal oscillator that is configured to operate at an internal free-running frequency or free-running frequency. Controllers 110, 111, and 112 typically include a power supply regulator. The internal oscillator is used to provide an operating frequency of the regulators. Controllers 110, 111, and 112 also have a single synchronization line 113 that is utilized to provide the operating frequency of each of controllers 110, 111, and 112.

Figure 2:
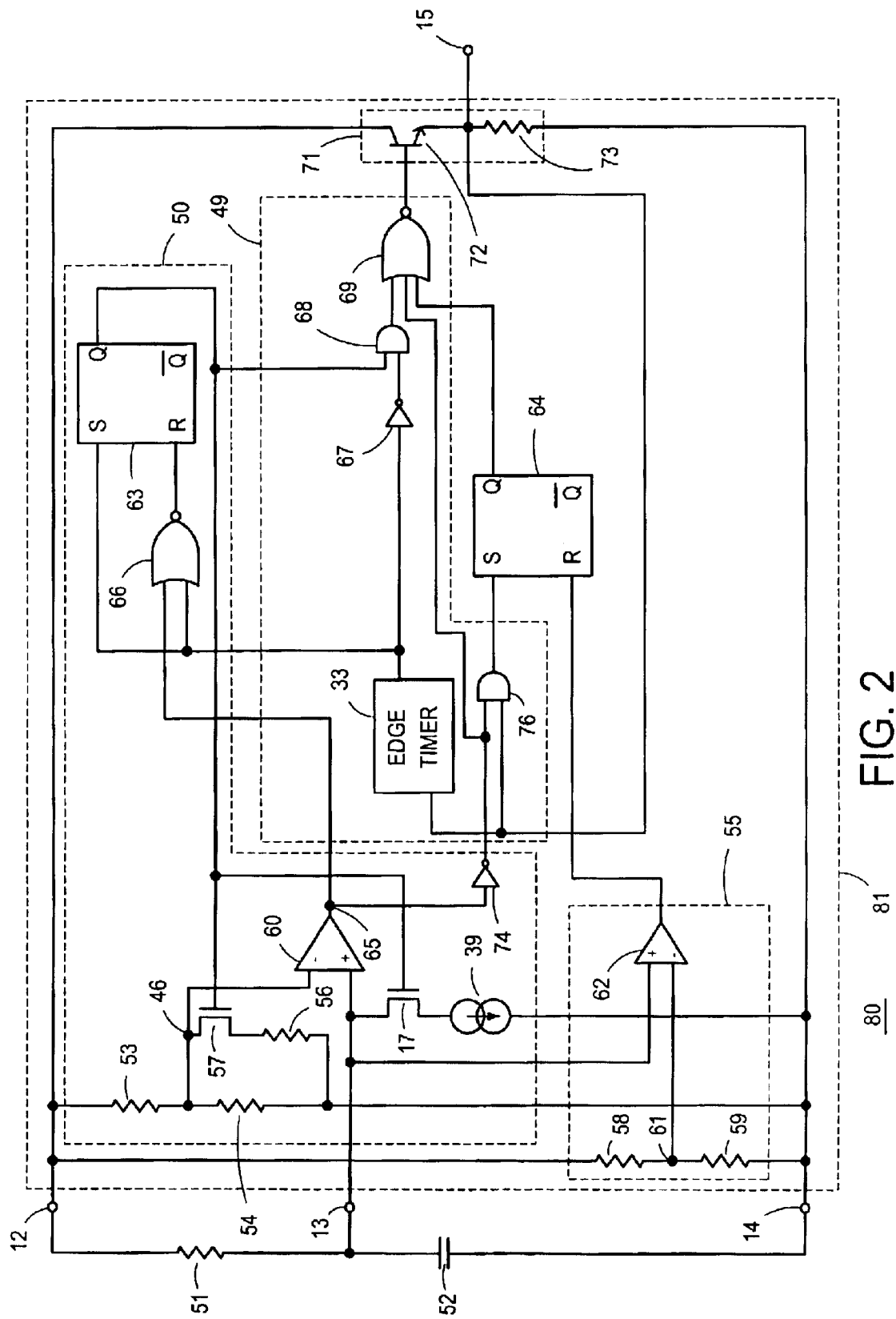
FIG. 2 schematically illustrates a first embodiment of a portion of a power supply controller in accordance with the present invention.

FIG. 2 schematically illustrates a portion of an embodiment of a power supply timing controller circuit 80 that is a portion of each of controllers 110, 111, and 112 shown in FIG. 1. Circuit 80 includes a bi-directional synchronization oscillator controller 81, generally illustrated by a dashed box, in addition to other electrical components that are not shown in FIG. 2. Bi-directional synchronization oscillator controller 81 includes a bi-directional synchronization port or bi-directional port 15 that receives an external synchronization pulse or sync signal that is generated externally to controller 81. Controller 81 includes an oscillator 50, generally illustrated by a dashed box, that functions as an oscillator for controller 81. Oscillator 50 includes an oscillator latch 63, an oscillator comparator 60, a timing input 13, reference resistors 53, 54, and 56, a reference switch or transistor 57, a discharge current source 39, and a discharge switch or transistor 17. An external charging resistor 51 and a timing capacitor 52 function to provide a selectable charging and discharging time base for oscillator 50. The voltage across capacitor 52 provides a timing voltage at input 13. Latch 63 assists in switching oscillator 50 between charging and discharging capacitor 52 to assist in providing the oscillation function. Oscillator 50 is formed either to operate at a free-running frequency or to generate a delay period. The free-running frequency and the delay period are determined by capacitor 52 and resistor 51 in addition to transistors 17 and 57, current source 39, and resistors 53, 54, 56, 58, and 59. Controller 81 is formed to operate at a controller frequency that is either the free-running frequency or a forced frequency determined by the external sync signal received on port 15. Those skilled in the art will note that resistor 51 functions as a current source for charging capacitor 52 and may be replaced by other current source implementations. Those skilled in the art will also recognize that resistor 51 and capacitor 52 are one possible implementation to provide a time base for oscillator 50 and that other implementations are possible including forming resistor 51 and capacitor 52 internal to oscillator 50. For example, a crystal oscillator that drives a programmable counter can be used to set the timing base. Current source 39 provides a controlled discharge time for capacitor 52. Source 39 may have alternate implementations including a resistor.

Port 15 receives the external synchronization pulse or sync signal that is generated externally to controller 81. Port 15 functions similarly to synchronization line 113 shown in FIG. 1. As will be seen hereinafter, controller 81 also internally generates an internal controller sync pulse or controller sync signal and under some conditions drives port 15 with the internally generated controller sync signal. A discriminator 49 of controller 81 assists in determining if controller 81 receives an externally generated sync pulse during a charging cycle of capacitor 52. After receiving the external sync signal on port 15 during a charging cycle, controller 81 latches the state of the received external sync signal and also inhibits controller 81 from driving port 15 with the controller sync signal. Controller 81 also inhibits oscillator 50 from oscillating at the free-running frequency and also enables oscillator 50 to generate the delay period. Controller 81 inhibits oscillator 50 and initiates generation of the delay period regardless of whether the frequency of the received external sync signal is greater than or less than the free-running frequency of oscillator 50. The delay period is greater than the period of the free-running frequency and typically is at least one hundred percent (100%) greater than the free-running period. In the preferred embodiment, the free-running frequency has a period of about 3.3 micro-seconds and the delay period is about 6.6 micro-seconds, however higher free-running frequencies are expected to be used in the future as power supply technology allows. The delay period is also greater than a period of the external sync signal.

Resistors 53, 54, and 56 along with transistor 57 function as a resistor divider to form a first or low reference voltage and a second or high reference voltage at a node 46. The low and high reference voltages facilitate the free-running oscillating operation of oscillator 50. Transistor 57 and resistors 53 and 54 are formed to generate the high reference voltage when transistor 57 is off. Transistor 57 and resistors 53, 54, and 56 are formed to generate the low reference voltage when transistor 57 is on. Enabling transistor 57 places resistor 56 in parallel with resistor 54 to facilitate forming the low reference voltage value.

Controller 81 generally operates in one of two modes, a master mode or a slave mode. In the master mode, controller 81 drives port 15 with the controller sync signal and oscillator 50 operates at the free-running frequency. In the slave mode, controller 81 does not drive port 15 with the controller sync signal, controller 81 inhibits oscillator 50 from operating at the free-running frequency and also enables oscillator 50 to generate the delay period, and controller 81 operates at the forced frequency determined by the external sync signal.

Controller 81 also includes a reset circuit 55 that is utilized to reset controller 81 from the slave mode and re-enable oscillator 50 to operate at the free-running frequency and re-enable controller 81 to drive port 15. Reset circuit 55 includes a reset voltage divider formed as a resistor 58 and a resistor 59 coupled as a resistor divider that generates a third reference voltage or a reset reference voltage at a reset node 61. A reset comparator 62 receives the reset reference voltage on an inverting input and receives the timing voltage on a non-inverting input. Comparator 62 generates a reset signal on an output of comparator 62 when the value of the timing voltage equals or exceeds the value of the reset reference voltage. Reset circuit 55 generally is viewed as a portion of oscillator 50.

In operation, without receiving an external sync signal controller 81 operates in the master mode and oscillator 50 runs at the free-running frequency. Comparator 60 receives the reference voltage through a connection between node 46 and an inverting input of comparator 60. Comparator 60 also receives the timing voltage developed across capacitor 52 through a connection between a non-inverting input of comparator 60 and timing input 13. An output of comparator 60 is connected to a node 65. Capacitor 52 has a first terminal connected to a power return 14 and a second terminal connected to input 13 while resistor 51 has a first terminal connected to input 13 and a second current terminal connected to a power source input 12.

Typically, capacitor 52 is initially discharged and begins charging upon applying power. Capacitor 52 charges through resistor 51 until the timing voltage on input 13 approximately equals the value of the reference voltage at node 46. Then, the output of comparator 60 switches to a high state which propagates through an inverter 74 and a NOR gate 69 turning on a transistor 72 of a butter 71. Transistor 72 is formed to drive a load of at least approximately one hundred pico farads (100 pf) at a frequency of at least one MHz (1 MHz) in order to provide a high drive capability. The rising edge of gate 69 creates a first or rising edge of a controller sync signal which drives buffer 71 and port 15 with the controller sync signal. The rising edge of the controller sync signal also triggers an edge timer 33 to produce a timer pulse of a controlled width or first time period. It should be noted that timer 33 is edge sensitive and produces the timer pulse upon a rising edge, thus, timer 33 can not be triggered to produce a pulse unless the input is low. The timer pulse sets latch 63 thereby turning on transistor 17 to initiate a discharge cycle of capacitor 52 and also turning on transistor 57 to change the reference voltage to the low reference voltage. The output of comparator 60 remains high during the discharge of capacitor 52 so that the output of inverter 74 remains low to gate 69. The high output of timer 33 through an inverter 67 ensures that buffer 71 continues to drive port 15 high. When timer 33 times out, the output of timer 33 goes low providing two high levels into a gate 68 thereby turning-off buffer 71 and allowing port 15 to go low. Thus, a controller sync pulse or signal is formed by the output of comparator 60 going high and is terminated when timer 33 times-out. Port 15 is driven with the controller sync signal. After the timer pulse expires, oscillator 50 continues to discharge capacitor 52 because the time constant of oscillator 50 is typically much greater than the time period of timer 33. In the preferred embodiment, timer 33 has a time period of approximately fifty nanoseconds (50 nsec.) which is much less than the discharge time of capacitor 52. Those skilled in the art will notice that controller 81 is formed so that capacitor 52 is discharged by source 39 and is charged by resistor 51, thus, the charge and discharge times are independently set. Consequently, waveforms that show the free-running frequency may be asymmetrical.

When capacitor 52 discharges to the low threshold voltage, the output of comparator 60 goes low. This sets the output of a NOR gate 66 to a high and resets latch 63 to a low which turns off transistor 17 to terminate discharging capacitor 52 and also turns off transistor 57 changing the value of the reference voltage of oscillator 50 to the high reference voltage. Thus, capacitor 52 once again begins charging to the high reference voltage value as discussed in the previous paragraph. These cycles continue unless an external sync signal is received on port 15.

The slave mode is initiated by an external sync signal received from a source external to controller 81. Controller 81 is formed to receive such an external sync signal from the external source and to latch a state of the received sync signal provided that oscillator 50 is not in the process of discharging capacitor 52. If the state of the received sync pulse were latched during a discharge cycle, capacitor 52 may be discharged earlier than that of the external circuit that sent the sync pulse thereby allowing controller 81 to begin charging capacitor 52 before the external circuit begins charging and permitting controller 81 to generate an externally going sync signal prior to the external circuit generating a second sync signal. Such a condition would cause jitter of the frequency of both controller 81 and the external circuit. Inhibiting oscillation at the free-running frequency and delaying operation by the delay period permits the external signal to be slower because it gives a larger operating window to permit a larger range of external frequencies and to prevent jitter of the frequency of controller 81.

Upon receiving the external sync signal from the external source, not shown, a leading edge of the received external sync signal triggers edge timer 33. If oscillator 50 is discharging capacitor 52, the output of timer 33 has no effect on latch 63 because it is already set. Receiving the external sync signal has no effect on slave latch 64 because node 65 is high thereby forcing a low on the set input of latch 64.

If capacitor 52 is charging when the external sync signal is received, latch 64 is set by the output of an AND gate 76 and controller 81 is set to the slave operating mode. Upon receiving the external sync signal, node 65 is low which provides a high to one input of gate 76 while the external sync signal provides another high to gate 76 thereby setting latch 64. The high from latch 64 forces the output of gate 69 low thereby disabling controller 81 from driving port 15 with the controller sync signal. The received external sync signal also triggers timer 33 to generate a timer pulse. The timer pulse sets latch 63 to a high thereby initiating a discharge cycle of capacitor 52. Setting latch 63 turns-on transistor 57 to change the reference voltage value to the low reference voltage and also turns-on transistor 17 to begin discharging capacitor 52. The output of edge timer 33 has no effect on port 15 because gate 69 is held low by the output of latch 64. Edge timer 33 times out after the timer pulse expires and oscillator 50 continues discharging capacitor 52.

Upon capacitor 52 being discharged to the low reference voltage value, the output of comparator 60 switches to a low level thereby setting the output of gate 66 to a high level and resetting the output of latch 63 to a low level which turns-off transistors 17 and 57 to terminate discharging of capacitor 52 and to change the reference voltage value to the high reference voltage value and oscillator 50 begins charging capacitor 52 towards that value. The charging continues until controller 81 either receives another external sync signal or until capacitor 52 charges the timing voltage past the high reference voltage to the reset reference voltage value. If another external sync signal is received before the timing voltage reaches the reset reference voltage value, the external sync signal triggers timer 33 to set latch 63 and start a discharge cycle as per the explanation in the previous paragraph. Using the reset reference value causes oscillator 20 to generate the delay period that is longer than the period of the free-running frequency because it takes longer to charge capacitor 52 to the reset reference voltage value.

If controller 81 does not receive an external sync signal on port 15, capacitor 52 charges until the timing voltage reaches the high reference voltage value. The output of comparator 60 and node 65 switch to a high level which removes the high from the reset input of latch 63 but has no effect on latch 63. The high from comparator 60 also causes the output of inverter 74 to go low which has no effect on latch 64 since port 15 was already low. Consequently, capacitor 52 continues charging until the timing voltage exceeds the reset reference voltage on node 61. Once the timing voltage reaches the reset reference voltage thereby causing the delay period to expire, the output of comparator 62 goes high which resets latch 64 and resets controller 81 from the slave mode. Since latch 63 is low and node 65 is high, resetting latch 64 forces the output of gate 69 high and generates a controller sync signal that is driven onto port 15. Thus, controller 81 is reset to once again drive port 15 with the controller sync signal. The controller sync signal is received by edge timer 33 which generates the timer pulse thereby setting latch 63 to a high level which begins discharging capacitor 52 and switches the reference voltage to the low reference voltage value. When the timer pulse expires, the output of gate 69 goes low thereby terminating the controller sync pulse on port 15. Thus, controller 11 is reset from operating at the forced frequency of the external sync signal, oscillator 50 is reset from generating the delay period, and oscillator 50 is re-enabled to operate at the free-running frequency.

In order to facilitate this operation, resistor 53 has a first terminal connected to input 12 and a second terminal connected to node 46. Resistor 54 has a first terminal connected node 46 and a second terminal connected to return 14. Resistor 56 has a first terminal connected to return 14 and a second terminal connected to a source of transistor 57. Transistor 57 has a drain connected to node 46 and a gate connected to the Q output of latch 63. Transistor 17 has a gate connected to the gate of transistor 57, a source connected to a first terminal of current source 39, and a drain connected to input 13. A second terminal of current source 39 is connected to return 14. The inverting input of comparator 60 is connected to node 46, the non inverting input is connected to input 13, and the output is connected to a first input of gate 66, node 65, and the input of inverter 74. A second input of gate 66 is connected to both the output of timer 33 and to the set input of latch 63 while the output of gate 66 is connected to a reset input of latch 63. The output of timer 33 is also connected to an input of inverter 67 which has an output connected to a first input of gate 68. A second input of gate 68 is connected to the Q output or output of latch 63, while the output of gate 68 is connected to a first input of gate 69. Gate 69 also has a second input connected to the Q output or output of latch 64, a third input connected to an output of inverter 74 and a first input of gate 76, and an output connected to an input of buffer 71 via a connection to a base of transistor 72. Transistor 72 has a collector connected to input 12 and an emitter connected to port 15 as well as to a first terminal of a resistor 73. Resistor 73 has a second terminal connected to return 14. Port 15 is also connected to an input of timer 33 and to a second input of gate 76. Gate 76 has an output connected to a set input of latch 64. Resistor 58 has a first terminal connected to input 12 and a second terminal connected to both node 61 and to a first terminal of resistor 59 while a second terminal of resistor 59 is connected to return 14. Comparator 62 has a non-inverting input connected to input 13, an inverting input connected to node 61, and an output connected to a reset input of latch 64.

Figure 3:
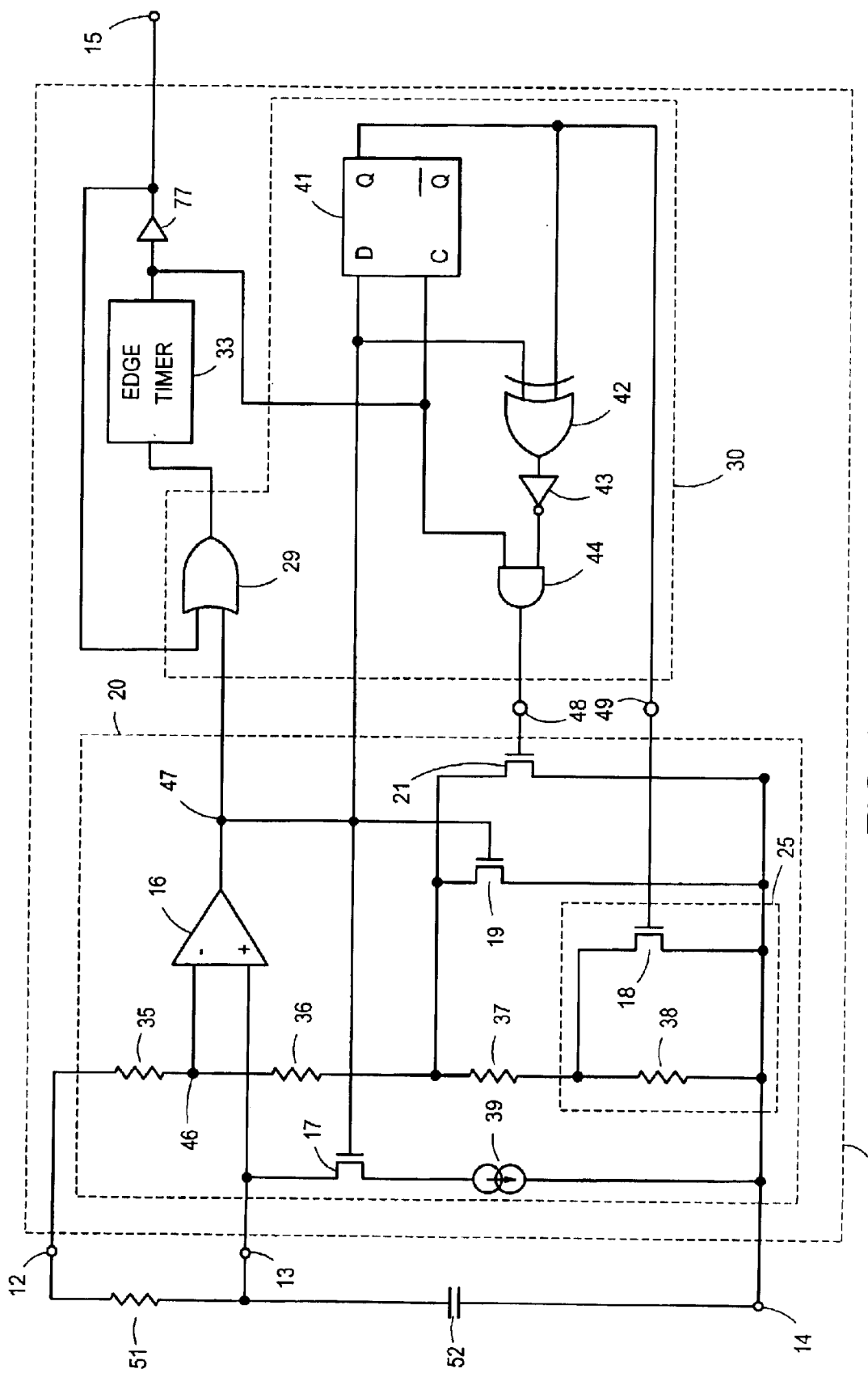
FIG. 3 schematically illustrates a portion of a second embodiment of a power supply controller in accordance with the present invention.

FIG. 3 schematically illustrates an embodiment of a power supply timing controller circuit 10 that is an alternate embodiment of circuit 80 discussed in the description of FIG. 2. Circuit 10 includes a bi-directional synchronization oscillator controller 11 that is similar to controller 81 described in the description of FIG. 2. Controller 11 includes an oscillator 20, edge timer 33, a reset reference voltage circuit 25, and a discriminator 30 that functions similar to discriminator 49 in FIG. 2. Oscillator 20, circuit 25, and discriminator 30 are generally illustrated by dashed boxes. Controller 11 also includes a master latch that latches a state of controller 11 including a master or slave state of controller 11. The master latch is implemented as a D-type flip-flop 41. A high on the Q output indicates that controller 11 is in the master mode and a low indicates that controller 11 is in the slave mode.

Oscillator 20 includes resistors 35, 36, 37, and 38 which function as a voltage divider to set various reference voltage values at reference node 46. Resistors 35, 36, 37, and 38 along with switches or transistors 18, 19, and 21 function to form the first or low reference voltage, the second or high reference voltage, and the third or reset reference voltage at node 46. Resistors 35, 36, 37, and 38 are formed to generate the low reference voltage when either of transistors 19 or 21 are enabled or on or closed. Resistors 35, 36, and 37 are formed to generate the high reference voltage when transistor 18 is on and transistors 19 and 21 are both disabled or off or open. Resistors 35 and 36 are formed to generate the reset reference voltage when transistors 18, 19, and 21 are all disabled or off or open. Reset circuit 25 assists forming the reset voltage value to reset controller 11 from the slave mode thereby allowing controller 11 to drive port 15. Reset circuit 25 includes resistor 38 and transistor 18.

Oscillator 20 is formed to either operate at a free-running frequency or generate the delay period. The frequency and period of the free-running frequency and the length of the delay period are determined by capacitor 52 and resistor 51 in addition to transistors 17, 18, 19, and 21, current source 39, and resistors 35, 36, 37, and 38. Controller 11 is formed to operate at a controller frequency that is either the free-running frequency or the forced frequency determined by the external sync signal received on port 15.

When an external sync pulse has not been received on port 15, oscillator 20 oscillates or operates at the free-running frequency and controller 11 generates a controller sync pulse that is driven by a buffer 77 onto port 15.

Buffer 77 may have a variety of implementations including the implementation of buffer 71 described in the description of FIG. 2. Preferably, buffer 77 is capable of driving a load of at least approximately one hundred pico farads (100 pf) at a frequency of at least one MHz (1 MHz) in order to facilitate increased drive capability. Discriminator 30 of controller 11 assists in determining if controller 11 receives an externally generated sync signal while capacitor 52 is charging. Under these conditions, controller 11 latches the state of the received external sync signal and also inhibits controller 11 from driving port 15 with the controller sync signal. Controller 11 also inhibits oscillator 20 from operating at the free-running frequency and enables oscillator 20 to generate the delay period. Controller 11 inhibits operating at the free-running frequency of oscillator 20 and enables generating the delay period regardless of whether the frequency of the received external sync signal is greater than or less than the free-running frequency. The length of the delay period is greater than a period of the free-running frequency and of a period of the external sync signal. The delay period typically is at least one hundred per cent (100%) greater than the free-running period. In the preferred embodiment, the free-running frequency has a period of about 3.3 micro-seconds and the delay period is about 6.6 micro-seconds, however higher free-running frequencies are expected to be used in the future as power supply technology allows. Using a delay period that is longer than the period of the free-running frequency and of the period of the external sync signal permits the external signal to be slower because it gives a larger operating window to permit a larger range of external frequencies and to prevent jitter of the frequency of both controller 11 and external circuits that would generate an external sync signal.

In operation, controller 11 generally operates in either the master mode or slave mode. In the master mode, controller 11 is formed to drive port 15 with the controller sync signal and to operate at the free-running frequency. In the slave mode, controller 11 does not drive port 15 with the controller sync signal, oscillator 20 is inhibited from operating at the free-running frequency and generates the delay period, and controller 11 operates at the forced frequency determined by the external sync signal.

Without receiving an external sync signal, controller 11 operates in the master mode. Typically, capacitor 52 is initially discharged and begins charging upon applying power. Capacitor 52 charges through resistor 51 until the timing voltage equals the value of the reference voltage at node 46 and the output of comparator 16 switches to a high driving node 47 high. The high output of comparator 16 turns-on transistor 17 to begin discharging capacitor 52 and also turns-on transistor 19 to change the reference voltage to the low reference voltage value. Node 47 remains high. The high going output of comparator 16 also forces the output of an OR gate 29 high. The rising edge of the output of gate 29 triggers timer 33 to produce the timer pulse. The timer pulse starts the controller sync signal and turns-on buffer 77 to drive port 15 with the controller sync signal. The timer pulse also clocks the state of node 47 into flip-flop 41. Since node 47 is high, the timer pulse sets flip-flop 41. This ensures that the Q output of flip-flop 41 is high. Since node 47 is high, the output of an exclusive OR gate or XOR gate 42 is low which enables an AND gate 44 through an inverter 43. Consequently, transistor 21 is on. However, transistor 19 is on because node 47 is high. When the timer pulse expires, the output of timer 33 goes low which disables transistor 21. This terminates the controller sync pulse and the corresponding signal driven onto port 15 by buffer 77. Thus, a controller sync pulse or signal is formed by the output of comparator 16 going high and triggering timer 33, and is terminated when timer 33 times-out. After the timer pulse expires, capacitor 52 continues to discharge toward the low reference voltage value because transistor 19 is still enabled and because the time constant of oscillator 20 is typically much greater than the timer pulse of timer 33.

When capacitor 52 discharges to the low reference value, the output of comparator 16 and node 47 go low thereby turning off transistor 19 to change the reference voltage to the high reference voltage value and also turning-off transistor 17 to begin charging capacitor 52. Timer 33 is not triggered and the Q output of flip-flop 41 remains high. Transistor 21 remains off since gate 44 has low inputs from timer 33 and inverter 43. Thus, capacitor 52 begins charging once again as discussed in the previous paragraph. These cycles continue unless an external sync signal is received on port 15. Those skilled in the art will notice that controller 11 and oscillator 20 are formed so that capacitor 52 is discharged by source 39 and is charged by resistor 51, thus, the charge and discharge times are independently set. Consequently, waveforms that show the free-running frequency may be asymmetrical.

The slave mode is initiated by an external sync signal received on port 15 from a source external to controller 11. Controller 11 is formed to receive such an external sync signal from the external source and to latch a state of the received sync signal provided that oscillator 20 of controller 11 is not in the process of discharging capacitor 52. In the slave mode, oscillator 20 starts the delay period while waiting to receive a subsequent external sync signal. The delay period is restarted when another external sync signal is received.

The external sync signal is received from the external source by gate 29. If node 47 is high and discharging capacitor 52, the output of gate 29 is already high and timer 33 is not triggered and the operation continues as previously discussed. If oscillator 20 is charging capacitor 52, node 47 is low allowing the external sync signal to trigger timer 33 and generate the timer pulse. The timer pulse applies a high to one input of gate 44. Meanwhile, the timer pulse is also clocking the previous low of node 47 into flip-flop 41 resetting the Q output low thereby setting controller 11 into the slave mode. The low from the Q output propagates through gate 42 producing a high at the output of inverter 43 and causing gate 44 to turn-on transistor 21. Thus transistor 21 is turned-on and changes the reference voltage to the low level. Since capacitor 52 is already charged above that level, comparator 16 drives node 47 high thereby turning on transistors 17 and 19 and forcing a discharge of capacitor 52. Timer 33 also applies the timer pulse to buffer 77 which regenerates the external sync signal on port 15. Timer 33 times out after the first time period expires and terminates regenerating the external sync signal. This beneficially regenerates and reinforces the external sync signal to other devices connected to port 15 and increases the size of the load that can be driven by the external sync signal. Oscillator 20 continues discharging capacitor 52.

Upon capacitor 52 discharging to the low reference voltage value, the output of comparator 16 and node 47 switch to a low level thereby turning-off transistors 17 and 19 to terminate discharging of capacitor 52 and to change the reference voltage to the reset reference voltage value so that oscillator 20 begins charging capacitor 52 to that value. The charging continues until controller 11 either receives another external sync signal or until capacitor 52 charges the timing voltage to the reset reference voltage. If another external sync signal is received before the timing voltage reaches the reset reference voltage value, the external sync signal triggers timer 33. Timer 33 then initiates a discharge cycle and regenerates the external sync signal by driving port 15. The timer pulse applies a high to one input of gate 44. The other input of gate 44 is already high from gate 42 receiving the low output from flip-flop 41 and node 47. Thus transistor 21 is turned-on and changes the reference voltage to the low level. However, capacitor 52 has already charged above that level so comparator 16 drives node 47 high thereby turning on transistors 17 and 19 and forcing a discharge of capacitor 52. Thus controller 11 is operating at the forced frequency provided by the frequency of the external sync signal.

If controller 11 does not receive an external sync signal on port 15, capacitor 52 charges until the timing voltage reaches the reset reference voltage value thereby causing the delay period to expire. The output of comparator 16 and node 47 switch to a high level which triggers timer 33 and which also turns on transistors 17 and 19 to begin discharging capacitor 52 and change the reference voltage value. The timer pulse from timer 33 is driven onto port 15 by buffer 77. The timer pulse also clocks the high of node 47 into flip-flop 41 setting the Q output. The high on the Q output turns-on transistor 21 which stays on as long as the timer pulse is high. The high on the Q output also resets controller 11 from the slave mode to the master mode thereby enabling controller 11 to once again drive port 15 with the controller sync signal. It should be noted that using the reset reference value to generate the delay period ensures that the delay period is a longer time period than the period of the free-running frequency. The delay period is longer because it takes longer to charge capacitor 52 to the reset reference voltage value than it takes to charge capacitor 52 to the high reference value.

Upon the timer pulse expiring, the controller sync signal is terminated and buffer 77 terminates driving port 15 high. When capacitor 52 discharges to the low reference value, the output of comparator 16 and node 47 go low thereby turning off transistor 19 to change the reference voltage to the high reference voltage value and also turning-off transistor 17 to begin charging capacitor 52. Timer 33 is not triggered and the Q output of flip-flop 41 remains high. Transistor 21 remains off since gate 44 has low inputs from timer 33 and inverter 43. Capacitor 52 continues charging until the voltage on capacitor 52 exceeds the high reference voltage value at node 46 and comparator 16 drives node 47 high. Node 47 going high initiates another controller sync signal and another discharge cycle. Oscillator 20 can now continue operating at this free-running frequency as previously described until another external sync signal is received.

In order to facilitate the operation of oscillator 20, resistor 35 has a first terminal connected to input 12, a second terminal connected to node 46 and to a first terminal of resistor 36. Resistor 37 has a first terminal connected to a second terminal of resistor 36, and to a drain of each of transistors 19 and 21. Resistor 38 has a first terminal connected to both a second terminal of resistor 37 and to a drain of transistor 18, and a second terminal connected to return 14. Comparator 16 has a non-inverting input connected to input 13, an inverting input connected to node 46, and an output connected to node 47 and to a gate of transistors 17 and 19. Transistors 18, 19, and 21 all have a source connected to return 14. Additionally, transistor 18 has a gate connected to an input 49 of oscillator 20, and transistor 21 has a gate connected to an input 48 of oscillator 20. Current source 39 has a first terminal connected to return 14 and a second terminal connected to a source of transistor 17. Transistor 17 also has a drain connected to input 13.

Timer 33 has an input connected to an output of gate 29 and an output connected to an input of buffer 77. Buffer 77 has an output connected to port 15 and to a second input of gate 29.

Additionally, flip-flop 41 has a data or D input connected to node 47 and to a first input of gate 42, a clock input connected to the output of timer 33, a Q output or output connected to input 49 of oscillator 20 and to a second input of gate 42. Gate 42 has an output connected to an input of inverter 43. Gate 44 has a first input connected to the output of inverter 43, a second input connected to the output of timer 33, and an output connected to input 48 of oscillator 20.

Figure 4:
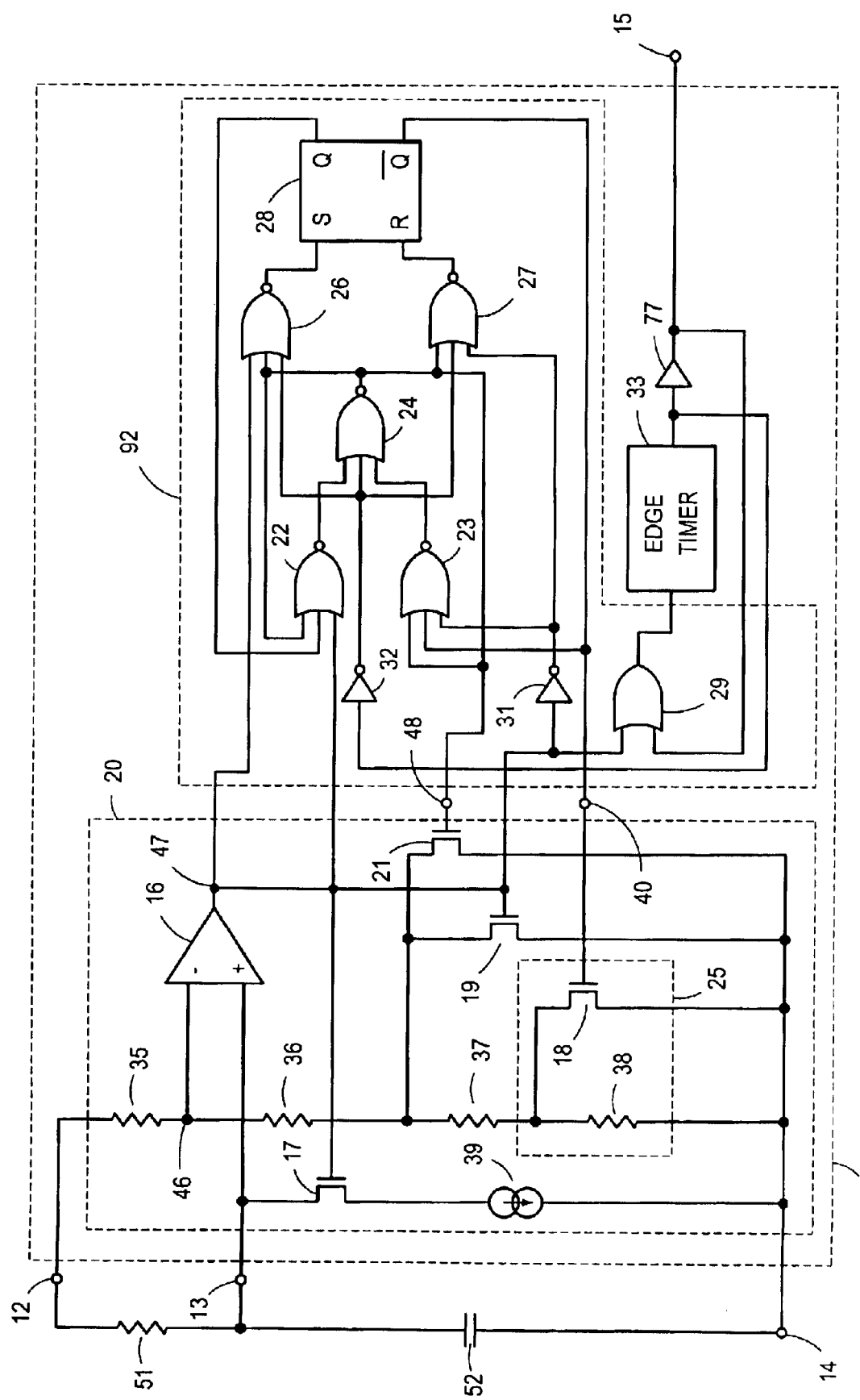
FIG. 4 schematically illustrates a portion of a third embodiment of a power supply controller in accordance with the present invention.

FIG. 4 schematically illustrates an embodiment of a power supply timing controller circuit 90 that is an alternate embodiment to circuit 10 discussed in the description of FIG. 3. Circuit 90 includes a bi-directional synchronization oscillator controller 91 that is similar to controller 11 described in the description of FIG. 3. Controller 91 includes oscillator 20, edge timer 33, reset reference voltage circuit 25, and a discriminator 92 that functions similar to discriminator 30 in FIG. 3. Oscillator 20, circuit 25, and discriminator 92 are generally illustrated by dashed boxes. Controller 91 also includes a master latch 28 that latches a state of controller 91 including a master or slave state of controller 91. A low on the Q output indicates that controller 91 is in a master mode and a high indicates that controller 91 is in a slave mode. When a sync pulse has not been received on port 15, oscillator 20 oscillates or operates at the free-running frequency and controller 91 generates a controller sync pulse that is driven by buffer 77 onto port 15.

Discriminator 92 functions similarly to discriminator 30 but has a different internal implementation in order to, among other features, operate latch 28. Discriminator 92 includes NOR gates 22, 23, 24, 26, and 27 and master latch 28. Discriminator 92 assists in determining if controller 91 receives an externally generated sync pulse while capacitor 52 is charging. Under these conditions, controller 91 latches the state of the received external sync signal and also inhibits controller 91 from driving port 15 with the controller sync signal. Controller 91 also inhibits oscillator 20 from oscillating and enables oscillator 20 to generate the delay period. Controller 91 changes the operation of oscillator 20 even if the frequency of the received external sync signal is greater than or less than the free-running frequency.

In operation, controller 91 generally operates in either the master mode or slave mode. In the master mode, controller 91 drives port 15 with the controller sync signal and operates at the free-running frequency. In the slave mode, controller 91 does not drive port 15 with the controller sync signal, inhibits oscillator 20 from operating at the free-running frequency, enables oscillator 20 to generate the delay period, and controller 91 operates at the forced frequency determined by the external sync signal.

Without receiving an external sync signal, controller 91 operates in the master mode. Typically, capacitor 52 initially is discharged and begins charging upon applying power. During the charging, timer 33 is not triggered, thus, an inverter 32 applies a high to the inputs of gates 24, 26, and,27 forcing the outputs low. Because of the low outputs, latch 28 does not change state during the charging. Capacitor 52 charges until the timing voltage equals the value of the reference voltage at node 46 and the output of comparator 16 switches to a high driving node 47 high. The high output of comparator 16 turns-on transistor 17 to begin discharging capacitor 52 and also turns-on transistor 19 to change the reference voltage to the low reference voltage value. Node 47 remains high. The high going output of comparator 16 holds gate 26 low and ensures that latch 28 is not set during the discharging cycle, and also forces gate 22 low. The high from comparator 16 also forces gate 29 high. The rising edge of the output of gate 29 triggers timer 33 to produce the timer pulse. The timer pulse turns-on buffer 77 to drive port 15 with the controller sync signal. The timer pulse also forces the output of gate 24 high since all inputs are low. The high from gate 24 holds the outputs of gates 26 and 27 low ensuring that latch 28 is not changed, and also turning-on transistor 21 in parallel with transistor 19. When the timer pulse expires, the output of timer 33 goes low which causes the output of gate 24 to go low turning-off transistor 21 but having no effect on latch 28. The timer pulse expiring terminates the controller sync signal and the corresponding signal driven onto port 15 by buffer 77. Thus, a controller sync signal is formed by the output of comparator 16 going high and triggering timer 33, and is terminated when timer 33 times-out. After the timer pulse expires, capacitor 52 continues to discharge toward the low reference voltage value because the time constant of oscillator 20 is typically much greater than the timer pulse of timer 33.

When capacitor 52 discharges to the low reference value, the output of comparator 16 and node 47 become a low thereby turning-off transistor 19 to change the reference voltage to the high reference value and also turning-off transistor 17 to begin charging capacitor 52. Node 47 remains low and timer 33 is not triggered. The low on node 47 forces the output of inverter 31 high thereby forcing the output of gates 23 and 27 low. Latch 28 is not changed unless an external sync signal is received. Thus, capacitor 52 is charging as discussed in the previous paragraph. These cycles continue unless an external sync signal is received on port 15 during a charging period.

The slave mode is initiated by an external sync signal received on port 15 from a source external to controller 91. Controller 91 is formed to receive such an external sync signal and to latch a state of the external sync signal provided that oscillator 20 is not in the process of discharging capacitor 52. The external sync signal is received by gate 29. If node 47 is high and discharging capacitor 52, the output of gate 29 is already high and timer 33 is not triggered and the operation continues as previously discussed. If oscillator 20 is charging capacitor 52, the other input of gate 29 is low allowing the external sync signal to trigger timer 33 to generate the timer pulse. The timer pulse forces gate 26 high through inverter 32. Node 47 is low which forces gates 23 and 27 low. Latch 28 is set by gate 26 going high so gate 22 is forced low providing three low inputs to gate 24 and forcing gate 24 high which forces the output of gate 26 low. Thus transistor 21 is turned-on and changes the reference voltage to the low level. The low reference voltage is applied to node 46 and comparator 16 switches to a high to turn-on transistor 17 and begin discharging capacitor 52. Timer 33 also applies the timer pulse to buffer 77 which regenerates or reinforces the external sync signal on port 15. Timer 33 times out after the first time period expires terminating the external sync signal and oscillator 20 continues discharging capacitor 52. The discharging continues until the timing voltage reaches the low reference voltage value. Then, comparator 16 drives node 47 low and beings another charging cycle. The charging continues until controller 91 either receives another external sync signal or until capacitor 52 charges the timing voltage to the reset reference voltage. If another external sync signal is received before the timing voltage reaches the reset reference voltage value, the external sync signal triggers timer 33 which causes transistor 21 to turn-on to start a discharge cycle and to regenerate the sync signal as per the explanation in the previous paragraph. Thus controller 91 is operating at the forced frequency of the external sync signal.

If controller 91 does not receive an external sync signal on port 15, capacitor 52 charges until the timing voltage reaches the reset reference voltage value thereby causing the delay period to expire. The output of comparator 16 and node 47 switch to a high level which turns on transistors 17 and 19 to begin discharging capacitor 52 and change the reference voltage, and to trigger timer 33. The timer pulse from timer 33 is driven onto port 15 by buffer 77. The timer pulse resets latch 28 through inverter 32 and gate 27 and resets controller 91 from the slave mode to the master mode and resets or re-enables controller 91 to drive port 15 with the controller sync signal. Resetting latch 28 enables transistor 18 and forces gate 23 low which provides three low inputs to gate 24. Thus, the output of gate 24 is forced high causing the output of gate 27 to go low. This turns on transistor 21 to change the reference voltage to the low level. The low reference voltage is applied to node 46 and comparator 16 switches to a high to turn-on transistor 17 and begin discharging capacitor 52 to the low reference voltage value. Upon the timer pulse expiring, the controller sync signal is terminated and buffer 77 terminates driving port 15 high. When capacitor 52 discharges to the low reference value, the output of comparator 16 and node 47 go low thereby turning off transistor 19 to change the reference voltage to the high reference voltage value and also turning-off transistor 17 to begin charging capacitor 52. Timer 33 is not triggered and the Q-bar output of latch 28 remains high. Capacitor 52 continues charging until the voltage on capacitor 52 exceeds the high reference voltage value at node 46 causing comparator 16 to drive node 47 high. Node 47 going high initiates another controller sync signal and another discharge cycle. Oscillator 20 can now continue operating at this internal frequency as previously described until another external sync signal is received.

In addition to the connections of oscillator 20, gate 23 has a first input connected to input 48 of oscillator 20, a second input connected to an output of inverter 31, a third input connected to input 40 of oscillator 20, and an output connected to a first input of gate 24. Gate 24 additionally includes a second input connected to an output of inverter 32, a third input connected to an output of gate 22, and an output connected to input 48 of oscillator 20 and to a first input of gates 26 and 27. Gate 26 has a second input connected to node 47, third input connected to both an output of inverter 32 and to a second input of gate 27, and an output connected to a set input of latch 28. Gate 27 includes a third input connected to the output of inverter 31 and an output connected to a reset input of latch 28. Gate 22 further includes a first input connected to input 48 of oscillator 20, a second input connected to node 47, and a third input connected to the Q output of latch 28. Inverter 32 has an input connected to the output of timer 33. Additionally, latch 28 has a Q-bar output connected to input 40 of oscillator 20.

In view of all of the above, it is evident that a novel device and method is disclosed. Included, among other features, is forming the oscillator to switch between oscillating at a free-running frequency and generating a time delay that permits synchronizing to external signals that are either slower or faster than the free-running frequency. It also provides a larger operating window to permit a larger range of external frequencies and to prevent jitter of the frequency of controller 81. Preventing jitter results in more stable system operation. Additionally additional external filters are not required to reduce jitter thereby lowering system costs.

What is claimed is:

1. A method of forming an oscillator controller comprising:
    forming the oscillator controller having an oscillator operable to oscillate at a first frequency and to form a delay period, and having a bi-directional synchronization port operable to receive an external synchronization signal driven by an external source and also operable to receive an oscillator controller synchronization signal generated by the oscillator controller;
    forming the oscillator controller to receive the external synchronization signal and responsively inhibit oscillation of the oscillator and start the delay period; and
    forming the oscillator controller to restart oscillation of the oscillator after the delay period expires.

2. The method of claim 1 wherein forming the oscillator controller to receive the external synchronization signal and responsively inhibit oscillation of the oscillator and start the delay period includes forming the delay period greater than a period of the first frequency and greater than a period of a second frequency of the external synchronization signal and further includes responsively inhibiting oscillation of the oscillator when the first frequency is greater than or less than the second frequency.

3. The method of claim 1 wherein forming the oscillator controller to receive the external synchronization signal from the external source and responsively inhibit oscillation of the oscillator and start the delay period includes inhibiting the oscillator controller from generating the oscillator controller synchronization signal.

4. The method of claim 1 wherein forming the oscillator controller to receive the external synchronization signal and responsively inhibit oscillation of the oscillator and start the delay period includes forming the oscillator controller to receive the external synchronization signal, latch a state of the external synchronization signal, and responsively operate the oscillator controller at a second frequency determined by the external synchronization signal.

5. The method of claim 4 wherein forming the oscillator controller to receive the external synchronization signal and latch the state of the external synchronization signal includes forming the oscillator controller to latch the state when the first frequency is one of greater than or less than the second frequency.

6. The method of claim 5 wherein forming the oscillator controller to latch the state when the first frequency is one of greater than or less than the second frequency includes forming the delay period to be greater than a period of the first frequency and a period of the second frequency.

7. The method of claim 1 wherein forming the oscillator controller to restart oscillation of the oscillator after the delay period expires includes restarting the oscillator to oscillate at the first frequency.

8. The method of claim 1 wherein forming the oscillator controller to restart oscillation of the oscillator after the delay period expires includes forming the oscillator controller to generate the oscillator controller synchronization signal after the delay period expires.

9. The method of claim 1 wherein forming the oscillator controller to receive the external synchronization signal and responsively inhibit oscillation of the oscillator and start the delay period includes forming the oscillator controller to detect an edge of the external synchronization signal.

10. The method of claim 1 wherein forming the oscillator controller to receive the external synchronization signal from the external source and responsively inhibit oscillation of the oscillator and start the delay period includes inhibiting the oscillator controller from generating the oscillator controller synchronization signal no more than one hundred nano-seconds after receiving the external synchronization signal.

11. A method of forming a oscillator controller comprising:
    forming an oscillator operable at a first frequency and operable to form a delay period;
    forming the oscillator controller operable to drive a bi-directional synchronization port of the oscillator controller; and
    forming the oscillator controller to receive an external synchronization signal on the bi-directional synchronization port and to responsively inhibit oscillation of the oscillator and start the delay period.

12. The method of claim 11 wherein forming the oscillator operable at the first frequency includes forming the oscillator controller to drive the bi-directional synchronization port upon each rising edge of an oscillator signal and upon receiving each external synchronization signal.

13. The method of claim 11 wherein forming the oscillator controller to receive the external synchronization signal includes forming the oscillator controller to latch a state of the external synchronization signal.

14. The method of claim 13 wherein forming the oscillator controller to latch the state of the external synchronization signal includes forming the oscillator controller to latch the state when a second frequency of the external synchronization signal is one of greater than or less than the first frequency.

15. The method of claim 14 further including forming the oscillator controller to reset from operating at the second frequency after not receiving the external synchronization signal before the delay period expires.

16. The method of claim 15 further including forming the oscillator controller to restart the delay period if an external sync signal is received prior to the delay period expiring.

17. The method of claim 11 further including forming the delay period greater than a period of the first frequency.

18. The method of claim 11 further including coupling the oscillator controller to another oscillator controller in a power supply system.

* * * * *